(12) United States Patent
Kuroda et al.

(10) Patent No.: US 8,818,147 B2
(45) Date of Patent: Aug. 26, 2014

(54) OPTICAL WAVEGUIDE SUBSTRATE AND METHOD FOR MANUFACTURING SAME

(75) Inventors: Toshihiro Kuroda, Ibaraki (JP); Daichi Sakai, Ibaraki (JP); Shigeyuki Yagi, Ibaraki (JP); Tomoaki Shibata, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 210 days.

(21) Appl. No.: 13/501,331

(22) PCT Filed: Oct. 12, 2010

(86) PCT No.: PCT/JP2010/067869
§ 371 (c)(1),
(2), (4) Date: May 17, 2012

(87) PCT Pub. No.: WO2011/046115
PCT Pub. Date: Apr. 21, 2011

(65) Prior Publication Data
US 2012/0219251 A1   Aug. 30, 2012

(30) Foreign Application Priority Data
Oct. 13, 2009   (JP) .................................. 2009-236356

(51) Int. Cl.
*G02B 6/12* (2006.01)
(52) U.S. Cl.
USPC .......................................................... 385/14
(58) Field of Classification Search
None
See application file for complete search history.

(56) References Cited

U.S. PATENT DOCUMENTS

| 7,936,953 | B2 * | 5/2011 | Johnson et al. .................. 385/14 |
| 8,315,491 | B2 * | 11/2012 | Hino et al. ....................... 385/31 |
| 2003/0210389 | A1 | 11/2003 | Matsumoto et al. | |

(Continued)

FOREIGN PATENT DOCUMENTS

| JP | 7-199078 | 8/1995 |
| JP | 08-136402 | 5/1996 |

(Continued)

OTHER PUBLICATIONS

Japanese Official Action dated Sep. 17, 2013, for JP Application No. 2009-236356.

(Continued)

*Primary Examiner* — Sung Pak
(74) *Attorney, Agent, or Firm* — Antonelli, Terry, Stout & Kraus, LLP.

(57) ABSTRACT

According to a manufacturing method of an optical waveguide substrate including a core (12) and clads (11) (13) and provided with an optical axis conversion mirror (14) in the core and an alignment recess for the optical axis conversion mirror with respect to a light receiving and emitting element, the recess is obtained by obtaining an outline of the core by synthesizing at least an image captured by focusing a microscope (20) to a highest position (14a) of the core in an optical axis conversion mirror portion and an image captured by focusing the microscope to a lowest position (14d), and by determining a position of the alignment recess in reference to a center of gravity of the outline, and according to an optical waveguide substrate obtained by this manufacturing method, it becomes possible to provide an optical waveguide substrate in which the optical axis conversion mirror in the optical waveguide substrate and the light receiving and emitting element are aligned with respect to each other at an extremely high degree of accuracy and a manufacturing method thereof.

7 Claims, 3 Drawing Sheets

(56) References Cited

U.S. PATENT DOCUMENTS

| | | | |
|---|---|---|---|
| 2004/0184737 A1* | 9/2004 | Oono et al. ................. 385/52 |
| 2005/0105860 A1* | 5/2005 | Oono et al. ................. 385/88 |
| 2006/0045410 A1 | 3/2006 | Trott et al. |
| 2006/0067608 A1 | 3/2006 | Kobayashi et al. |
| 2006/0198569 A1 | 9/2006 | Ohtsu et al. |
| 2006/0210217 A1 | 9/2006 | Umezawa |
| 2007/0019899 A1 | 1/2007 | Ohtsu et al. |
| 2007/0297713 A1* | 12/2007 | Lu et al. ................. 385/14 |
| 2008/0152286 A1 | 6/2008 | Ueno et al. |
| 2008/0310848 A1 | 12/2008 | Yasuda et al. |
| 2011/0157738 A1* | 6/2011 | Shimazawa et al. ........ 360/59 |

FOREIGN PATENT DOCUMENTS

| | | |
|---|---|---|
| JP | 2000-276121 | 10/2000 |
| JP | 2000-357229 | 12/2000 |
| JP | 2002-090586 | 3/2002 |
| JP | 2004-247652 | 9/2004 |
| JP | 2005-37869 | 2/2005 |
| JP | 2005-037870 | 2/2005 |
| JP | 2006-60004 | 3/2006 |
| JP | 2006-91241 | 4/2006 |
| JP | 2006-243467 | 9/2006 |
| JP | 2006-258863 | 9/2006 |
| JP | 2006-267501 | 10/2006 |
| JP | 2007-33698 | 2/2007 |
| JP | 2007-241211 | 9/2007 |
| JP | 2008-511860 | 4/2008 |
| JP | 2008-152064 | 7/2008 |
| JP | 2008-159766 | 7/2008 |
| JP | 2008-216794 | 9/2008 |
| JP | 2008-256870 | 10/2008 |
| JP | 2008-310066 | 12/2008 |
| WO | WO 2006/028564 A1 | 3/2006 |
| WO | WO 2007/091733 A2 | 8/2007 |
| WO | WO 2009/096422 A1 | 8/2009 |

OTHER PUBLICATIONS

K. Oba, "Zen Shuten Kenbikyo Camera to Oyo", *O plus E*, vol. 27, No. 3, Feb. 25, 2005, pp. 280-283.

M. Kimura, "Confocal microscopes: rapid measurement of 3D objects", *Nikkei Electronics*, No. 952, May 21, 2012, pp. 95-100.

* cited by examiner (a)   (b)   (c)   (d)

OPTICAL WAVEGUIDE SUBSTRATE AND METHOD FOR MANUFACTURING SAME

TECHNICAL FIELD

The present invention relates to an optical waveguide substrate and a manufacturing method thereof, and more particularly, to an optical waveguide substrate in which an optical axis conversion mirror in the optical waveguide substrate and a light receiving and emitting element are aligned with respect to each other with accuracy and a manufacturing method thereof. Also, the present invention relates to an optoelectric hybrid board obtained by combining the optical waveguide and electrical wiring and a manufacturing method thereof and to an alignment recess forming apparatus for an optical waveguide substrate.

BACKGROUND ART

With high-speed and high-density signal transmissions between electronic elements or between circuit boards in recent years, an increase in speed and density by transmissions via electrical wiring in the related art is approaching the limit because of an obstacle, such as mutual interference and attenuation of signals. In order to overcome such an obstacle, a technique of connecting one electronic element to another or one circuit board to another by means of light, so-called optical interconnection, is under study. Attention is being given to a polymer optical waveguide because it can be easily processed into an optical transmission path, it is inexpensive, a degree of freedom in wiring is high, and a density can be increased.

For a device using such optical communications, it is necessary to couple a light signal and an electrical signal to each other. Hence, it is necessary to bring optical axes of the optical waveguide and the light receiving and emitting element into agreement with each other. As a method of coupling a light signal and an electrical signal, it is general to use an optical axis conversion mirror configured to totally reflect light on an inclined surface that is preliminarily formed at an end of a core at an angle of 45 degrees with respect to a longitudinal direction of the core.

Incidentally, in order to bring the optical axes into agreement with each other by disposing an optical waveguide substrate and an electric circuit board in lamination, the following is proposed. That is, alignment markers are provided to both of the optical waveguide substrate and the electric circuit board. Hence, by matching these alignment marks, an optical axis of a light receiving and emitting element on the electric circuit board and an optical axis of the optical waveguide in the optical waveguide substrate can be aligned with respect to each other easily in a reliable manner (see Paragraph 0028 in Patent Document 1).

Also, there is proposed an optical element mounted wiring board in which a film-like optical waveguide is disposed on a ceramic substrate, which is a multi-layer wiring board and has a metal wiring layer as an inner layer, by fitting a guide pin into an alignment hole (see Paragraphs 0054 through 0059 in Patent Document 2).

Patent Documents 1 and 2, however, fail to provide detailed descriptions as to in which manner the alignment marker and the alignment hole are obtained with accuracy. Hence, these disclosures are proposals on the precondition that the alignment marker and the alignment hole are formed with a high degree of accuracy.

It is general to adopt the following method as a method of forming the alignment marker and the like. That is, an alignment metal marker is preliminarily formed in the vicinity of an optical waveguide by resist exposure, development, metal deposition, and resist separation processes. Then, an optical axis conversion mirror is manufactured at a constant distance from the marker by a grinding process using a dicer. The optical axes are brought into agreement with each other by this optical axis conversion mirror.

PRIOR ART DOCUMENTS

Patent Documents

Patent Document 1: JP-A-2002-90586
Patent Document 2: JP-A-2005-37870

SUMMARY OF THE INVENTION

Problems that the Invention is to Solve

In the manufacturing of the alignment marker and the like in the related art, satisfactory positional accuracy can be obtained with the optical element mounted wiring board in the related art. However, the use of an optical waveguide in mobile phones, notebook computers and the like is now under study and it is crucial to reduce a size of the light receiving and emitting element and increase a wiring density for saving in space and reduction in thickness. Hence, there is a need of a higher degree of accuracy for alignment of optical wiring and electrical wiring.

Under these circumstances, when the alignment marker is formed in the vicinity of the waveguide by the method in the related art, relative positional misalignment in the order of ±10 to 20 μm is expected to occur in terms of alignment accuracy during exposure. It is anticipated that misalignment in the order of ±10 to 20 μm is further added during the processing of the optical axis conversion mirror as relative positional misalignment with respect to the alignment marker.

In contrast, a currently required amount of relative positional misalignment between the optical waveguide and the light receiving and emitting element is within ±10 μm. Accordingly, satisfactory positional accuracy cannot be obtained with the method in the related art.

In order to solve these problems, the present invention has an object to provide an optical waveguide substrate in which an optical axis conversion mirror in an optical waveguide substrate and a light receiving and emitting element are aligned with respect to each other at an extremely high degree of accuracy and a manufacturing method thereof, and further an opto-electric hybrid board obtained by combining the optical waveguide and electrical wiring and a manufacturing method thereof as well as an alignment recess forming apparatus for an optical waveguide substrate.

Means for Solving the Problems

The inventors of the present invention conducted assiduous studies and discovered that the problems as above can be solved by preliminarily providing an optical axis conversion mirror in a core and by determining a center of gravity of the mirror surface using an optical microscope or the like and subsequently determining a position of an alignment recess in reference to the center of gravity. The present invention was completed on the basis of the knowledge thus discovered.

That is, the present invention provides a manufacturing method of an optical waveguide substrate including a core and a clad and provided with an optical axis conversion mirror in the core and an alignment recess for the optical axis conversion mirror with respect to a light receiving and emitting element, in which the recess is obtained by obtaining an outline of the core by synthesizing at least an image captured by focusing a microscope to a highest position of the core in the optical axis conversion mirror and an image captured by focusing the microscope to a lowest position, and determining a position of the alignment recess in reference to a center of gravity of the outline, an optical waveguide substrate obtained by this manufacturing method in which the optical axis conversion mirror in the optical waveguide substrate and the light receiving and emitting element are aligned with respect to each other at an extremely high degree of accuracy, and further an opto-electric hybrid board obtained by combining the optical waveguide and electrical wiring and a manufacturing method thereof as well as an alignment recess forming apparatus for an optical waveguide substrate.

Advantage of the Invention

According to the method of the present invention, it becomes possible to provide an optical waveguide substrate in which an optical axis conversion mirror in the optical waveguide substrate and a light receiving and emitting element are aligned with respect to each other at so extremely high a degree of accuracy that a transmission loss of light is small and a manufacturing method thereof, and further an opto-electric hybrid board obtained by combining the optical waveguide and electrical wiring and a manufacturing method thereof as well as an alignment recess forming apparatus for an optical waveguide substrate. More specifically, it becomes possible to manufacture an opto-electric hybrid board in which an amount of relative positional misalignment of the optical waveguide with respect to the light receiving and emitting element is within ±10 μm.

MODE FOR CARRYING OUT THE INVENTION

An optical waveguide substrate of the present invention includes a core and a clad and is provided with an optical axis conversion mirror in the core and an alignment recess for the optical axis conversion mirror with respect to a light receiving and emitting element. Also, a manufacturing method of the present invention includes obtaining an outline of a core by synthesizing at least an image captured by focusing a microscope to a highest position of the core in an optical axis conversion mirror portion and an image captured by focusing the microscope to a lowest position, and determining a position of an alignment recess in reference to a center of gravity of the outline.

Regarding the outline of the core, materials of the core and the clad have mutually different refractive indices but these materials are of the same nature; moreover these materials have high transparency. Hence, it is not easy to determine the outline of the core. However, with the use of the method of the present invention, the outline of the core can be determined easily and the alignment recess can be determined in reference to a center of gravity of the outline. It thus becomes possible to align the optical axis conversion mirror and the light receiving and emitting element with respect to each other at an extremely high degree of accuracy.

Hereinafter, the manufacturing method of the present invention will be described in detail using FIG. 1 and FIG. 2.

Method of Obtaining Outline of Core

Figure 1:
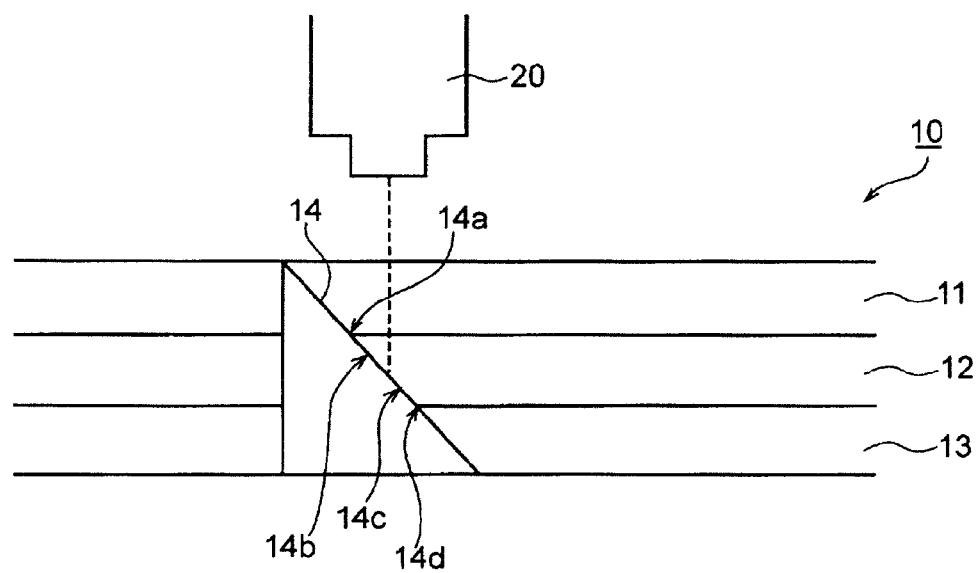
FIG. 1 is a conceptual view showing a method of obtaining an outline of a core.

FIG. 1 is a conceptual view showing a method of obtaining an outline of the core. According to the manufacturing method of the present invention, in an optical waveguide 10 formed of an upper clad 11, a core portion 12, and a lower clad 13 and provided with an optical axis conversion mirror 14, an outline of the core is obtained by observing the mirror 14 through an optical microscope or the like. In other words, during the observation, the mirror 14 is observed while shifting a focal point by moving up or down the lens of an optical microscope 20. More specifically, an image is obtained by focusing the microscope to a highest position 14a of the core in the optical axis conversion mirror 14 (a position in contact with the upper clad 11; hereinafter, occasionally referred to also as the top point). Subsequently, the lens of the optical microscope 20 is lowered and an image is obtained by focusing the microscope to a lowest position 14d of the core in the optical axis conversion mirror 14 (a position in contact with the lower clad 13; hereinafter, occasionally referred to also as the bottom point). An outline of the core is obtained by synthesizing these two images.

Figure 2:
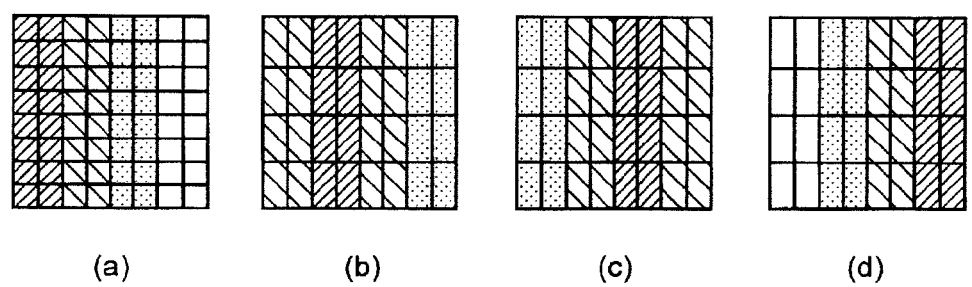
FIG. 2 is a view showing image drawings of observation images viewed through an optical microscope.

Image drawings of observation images viewed through the optical microscope at the top point, the bottom point, and midpoints are shown in FIG. 2. FIG. 2(a) is an image drawing at the top point and FIG. 2(d) is an image drawing at the bottom point. In FIG. 2(a), because the microscope is focused to the highest position 14a of the core in the optical axis conversion mirror 14, it appears that luminance on the leftmost segment is high and luminance becomes lower with an increasing rightward distance. On the contrary, in FIG. 2(d), because the microscope is focused to the lowest position 14d of the core in the optical axis conversion mirror 14, it appears that luminance on the rightmost segment is high. Further, for example, when a space between 14a and 14d is divided by four and observation images viewed through the optical microscope are obtained at 14b and 14c of FIG. 1, image drawings as are shown, respectively, in FIG. 2(b) and FIG. 2(c) are obtained.

An example shown in FIG. 2(a) indicates the following. That is, luminance in the leftmost ¼ segment is the highest (8/8 where denoted by dense diagonal shades in FIG. 2). Luminance in the following ¼ segment is about half the highest luminance (⁴⁄₈ where denoted by less dens diagonal shades in FIG. 2). Luminance in the following ¼ segment is about half the second highest luminance (²⁄₈ where denoted by dots in FIG. 2). Luminance in the rightmost ¼ segment is about half the third highest luminance (⅛ where denoted by blank in FIG. 2). Likewise, luminances in FIG. 2(b) through FIG. 2(d) are as set forth in Table 1 below. It should be appreciated, however, that this is a mere example. Also, 8/8 referred to herein represents the highest step 8 when luminance is classified to eight steps. Likewise, ⁴⁄₈, ²⁄₈, and ⅛ represent relative luminance steps 4, 2, and 1, respectively, when the luminance is classified into eight steps.

TABLE 1

|         | Leftmost 1/4 | Following 1/4 | Following 1/4 | Rightmost 1/4 |
|---------|--------------|---------------|---------------|---------------|
| FIG. 2(a) | 8/8 | 4/8 | 2/8 | 1/8 |
| FIG. 2(b) | 4/8 | 8/8 | 4/8 | 2/8 |
| FIG. 2(c) | 2/8 | 4/8 | 8/8 | 4/8 |
| FIG. 2(d) | 1/8 | 2/8 | 4/8 | 8/8 |

In the present invention, an outline of the core is obtained by synthesizing at least the image drawings obtained in FIG. 2(a) and FIG. 2(d). However, as described above, by dividing the space by four to obtain the image drawings of FIG. 2(b) and FIG. 2(c) so that an outline of the core is obtained by additionally synthesizing these image drawings, it becomes possible to obtain an outline of the core with a higher degree of accuracy. The space may be divided by more than four. For example, by dividing the space by ten, it becomes possible to obtain an outline of the core with a further higher degree of accuracy.

Subsequently, a position of the alignment recess is determined in reference to a center of gravity of the outline of the core obtained by the method described above. Herein, the center of gravity of the outline of the core can be an intersection of diagonal lines of the outline.

Formation of Alignment Recess

Subsequently, the recess is obtained by determining a position of the alignment recess in reference to the center of gravity of the outline. Generally, the alignment recess can be formed by drilling or the like. However, a manner in which to form the alignment recess is not particularly limited. Herein, the alignment recess may be a through-hole or a non-penetrating recess (hollow). From the viewpoint of facilitating the alignment, a through-hole is more preferable.

Also, when the optical axis conversion mirror and the light receiving and emitting element are aligned with respect to each other, it is generally necessary to determine the alignment recess at least at two points. However, a distance from the center of gravity of the outline to the alignment recess is determined to suit a size of the optical waveguide or the like and is not particularly limited. For example, in a case where the optical waveguide and an extremely small light receiving and emitting element are bonded to each other, a distance from a center of gravity of the outline of the core to the alignment recess is about 300 µm to 3000 µm.

The light receiving and emitting element used in the present invention is not particularly limited. A light emitting element can be, for example, an edge emitting laser (semiconductor laser), a light-emitting diode, a vertical cavity surface emitting laser (VCSEL), or the like. Of these examples, a vertical cavity surface emitting laser (VCSEL) is more preferable because a size can be increased and a high-speed driving is possible; moreover, it is inexpensive and consumes less power. Also, alight receiving element can be a photodiode, a CCD (Charge Coupled Device Image Sensor), or the like. In terms of high-speed responsivity, it is preferable to use a photodiode.

Manufacturing of Opto-Electric Hybrid Board

Figure 3:
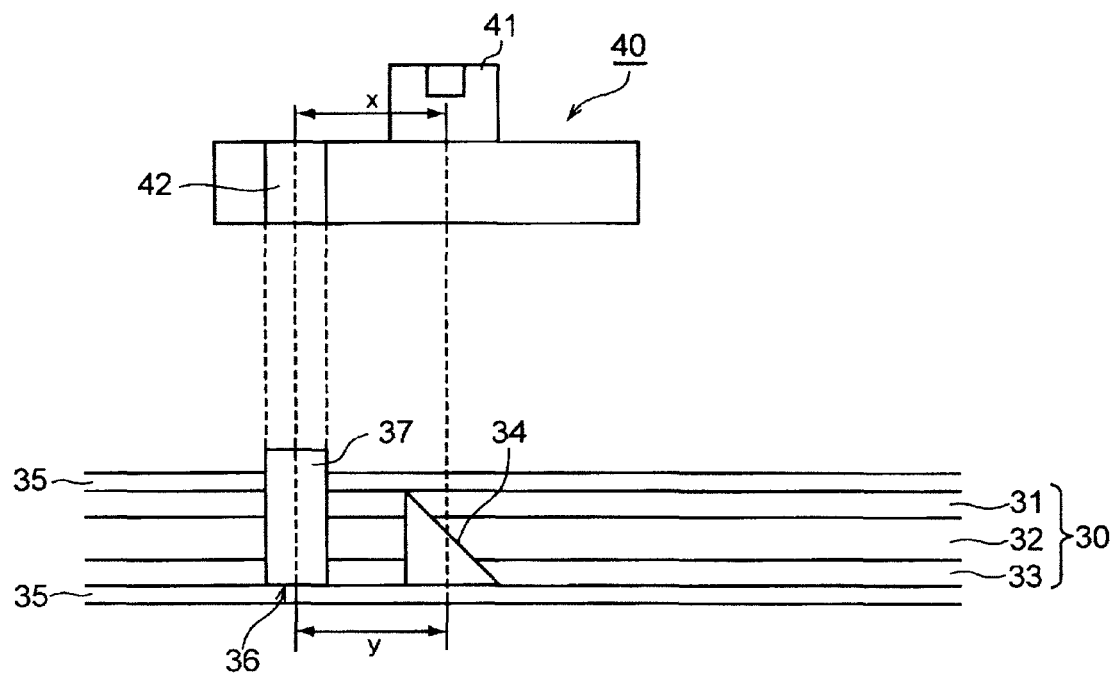
FIG. 3 is a conceptual view showing a connecting method of an optical waveguide and a light receiving and emitting element mounted substrate.

With reference to FIG. 3, a description will now be given to a method of manufacturing an opto-electric hybrid board by connecting an optical waveguide and a light receiving and emitting element mounted board in a case where the alignment recesses obtained by the method described above are through-holes by way of example.

An optical waveguide 30 shown in FIG. 3 is formed of an upper clad 31, a core portion 32, and a lower clad 33 and has an optical axis conversion mirror 34. The optical waveguide 30 further has a protective plate 35 to enhance strength of the mirror 34.

The optical waveguide 30 has an alignment recess (hereinafter, referred to as the positioning through-hole 36) obtained by the method described above. The positioning through-hole 36 is provided with a pin 37 used when the optical waveguide 30 is fit to the light receiving and emitting element mounted board.

Meanwhile, a light receiving and emitting element mounted substrate 40 has a light receiving and emitting element 41 and a positioning through-hole 42. Herein, a distance X between the light receiving and emitting element 41 and the positioning through-hole 42 is given as a distance coinciding with a distance Y between the center of gravity of the outline of the core and the position of the alignment recess found by the method described above.

Hence, by fitting the pin 37 into the positioning through-hole 42, it becomes possible to obtain an opto-electric hybrid board with an extremely high degree of accuracy, that is, in which a center portion of the light receiving and emitting element and the center of gravity of the optical axis conversion mirror in the optical waveguide coincide with each other at an extremely high degree of accuracy. More specifically, it becomes possible to obtain an opto-electric hybrid board in which the center portion of the light receiving and emitting element and the center of gravity of the optical axis conversion mirror in the optical waveguide coincide with each other with accuracy that the relative positional misalignment is within ±10 µm.

It is preferable to use an optical waveguide film as the optical waveguide and a flexible electrical wiring board is preferable as the light receiving and emitting element mounted substrate. This is because an opto-electric hybrid board with excellent flexibility can be obtained when configured in this manner.

Hereinafter, an optical waveguide film and a flexible electrical wiring board suitably used in the present invention will be described.

Optical Waveguide Film

An optical waveguide film of the present invention includes a core and a clad and the one used as an optical waveguide film in the related art is available. For example, a resin film for forming an optical waveguide made of a resin composition containing a base polymer (A), a photopolymerizable compound (B), and a photopolymerization initiator (C).

A purpose of the base polymer (A) is to secure strength when a hardened material, such as a film, is formed and the base polymer (A) is not particularly limited as long as the base polymer can achieve the intended purpose. Examples include but not limited to phenoxy resin, epoxy resin, (meta)acryl resin, polycarbonate resin, polyarylate resin, polyether amide, polyetherimide, polyether sulfone, and derivatives thereof. One or a mixture of two or more of these base polymers can be used.

The photopolymerizable compound (B) is not particularly limited as long as the compound polymerizes with irradiation of light, such as ultraviolet rays. However, in terms of responsivity to light, a compound having an unsaturated ethylene group within a molecule is preferable. More specifically, examples include but not limited to (meta)acrylate, vinylidene halide, vinyl ether, vinylpyridine, and vinylphenol. Of these examples, in terms of transparency and heat resistance, (meta)acrylate is preferable. Any of mono-functional, bi-functional, and tri-functional (meta)acrylate can be used.

Herein, the term, (meta)acrylate, means acrylate and methacrylate.

A photopolymerization initiator as the component (C) is not particularly limited, and examples include but not limited to: aromatic ketone, such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzil-2-dimethylamino-1-(4-morpholinophenyl)-butane-1-one, 2,2-dimethoxy-1,2-diphenylethane-1-one, 1-hydroxycyclohexylphenyl ketone, 2-hydroxy-2-methyl-1-phenylpropane-1-one, 1-[4-(2-hydroxyethoxy)phenyl]-2-hydroxy-2-methyl-1-propane-1-one, and 1,2-methyl-1-[4-(methylthio)phenyl]-2-morpholinopropane-1-one; quinones, such as 2-ethyl anthraquinone, phenanthrene quinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether compounds, such as benzoin methyl ether, benzoin ethyl ether, and benzoin phenyl ether; benzoin compounds, such as benzoin, methyl benzoin, and ethyl benzoin; benzyl derivatives, such as benzyl dimethylketal; 2,4,5-triarylimidazole dimers, such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, a 2-(o-methoxyphenyl)-4,5-diphenylimidazole dimer, and a 2-(p-methoxyphenyl)-4,5-diphenylimidazole dimer; phosphine oxides, such as bis(2,4,6-trimethylbenzoyl)phenylphosphine oxide, bis(2,6-dimethoxybenzoyl)-2,4,4-trimethylpentylphosphine oxide, and 2,4,6-trimethylbezoyl diphenylphosphine oxide; acridine derivatives, such as 9-phenylacridine and 1,7-bis(9,9'-acridinyl)heptane'; N-phenylglycine, N-phenylglycine derivatives, and coumarin-based compounds.

It is preferable to set a blending amount of the base polymer (A) to 10 to 80 mass % on the basis of a total amount of the component (A) and the component (B). When the blending amount is 10 mass % or greater, it becomes possible to manufacture a thick film having a film thickness of 50 μm or greater easily when a film is formed. Meanwhile, when the blending amount is 80 mass % or less, a photo-curing reaction proceeds sufficiently. In view of the foregoing, it is further preferable to set a blending amount of the base polymer (A) to 20 to 70 mass %.

It is preferable to set a blending amount of the photopolymerizable compound (B) to 20 to 90 mass % on the basis of a total amount of the component (A) and the component (B). When the blending amount is 20 mass % or greater, curing can take place easily in entanglement with the base polymer. Meanwhile, when the blending amount is 90 mass % or less, it becomes possible to form a thick film easily. In view of the foregoing, it is further preferable to set a blending amount of the photopolymerizable compound (B) to 30 to 80 mass %.

It is preferable to set a blending amount of photopolymerization initiator (C) to 0.1 to 10 parts by mass on the basis of a total of 100 parts by mass of the component (A) and the component (B). When the blending amount is 0.1 part by mass or greater, photo-sensitivity is sufficient. Meanwhile, when the blending amount is 10 parts by mass or less, light absorption on a surface layer of a photosensitive resin composition is not increased during exposure and light curing in the inside becomes sufficient. Further, such a blending amount is suitable because a propagation loss is not increased by influences of light absorption by the polymerization initiator itself. In view of the foregoing, it is further preferable to set a blending amount of the polymerization initiator (C) to 0.2 to 5 parts by mass.

The optical waveguide film of the present invention can be manufactured easily by dissolving the resin composition containing the components (A) through (C) in a solvent, applying the resulting solution on a base material, and removing the solvent. A solvent used herein is not particularly limited as long as the solvent can dissolve the resin composition. For example, solvents, such as acetone, methyl ethyl ketone, methyl cellosolve, ethyl cellosolve, toluene, N,N-dimethylformamide, N,N-dimethylacetamide, and propylene glycol monomethyl ether, or a mixture of these solvents can be used. Generally, a concentration of solids in the resin solution is preferably about 30 to 60 mass %.

A thickness of the optical waveguide film of the present invention is not particularly limited and a thickness of the dried film is normally 10 to 250 μm. When the thickness is 10 μm or greater, there is an advantage that a bonding tolerance to the light receiving and emitting element can be broadened. When the thickness is 250 μm or less, there is an advantage that bonding efficiency to the light receiving and emitting element can be enhanced. In view of the foregoing, it is further preferable to set a thickness of the film to a range of 40 to 90 μm.

A base material used in the manufacturing process of the resin film for forming an optical waveguide of the present invention is a supporting body that supports the optical waveguide forming film. A material thereof is not particularly limited. However, polyester, such as polyethylene terephthalate, and polypropylene as well as polyethylene and the like are suitably used from the viewpoint that these materials are easily separated from the film for forming the optical waveguide later and have heat resistance and solvent resistance. It is preferable that a thickness of the base material is in a range of 5 to 50 μl. When the thickness is 5 μm or greater, there is an advantage that strength as a supporting body can be readily obtained. When the thickness is 50 μm or less, there is an advantage that a finer pattern can be formed because a gap between the base material and a mask during pattern formation becomes smaller. In view of the foregoing, it is more preferable that a thickness of the base material is in a range of 10 to 40 μm and it is further preferable that the thickness is 20 to 30 μm.

The film for forming the optical waveguide provided on the base material obtained in this manner can be stored easily, for example, by being wound up in a roll. In addition, it is also possible to provide a protective film on the film for forming the optical waveguide when a need arises. An antistatic treatment or the like may be applied to the base material and the protective film to facilitate separation of the film for forming the optical waveguide at a later time.

A description will be given to a manufacturing method of forming an optical waveguide using the resin film for forming an optical waveguide obtained as described above. An example of this method can be a method by which a lower clad film separated from the base material is layered on the substrate by press-bonding with heating after the protective film is removed in a case where the protective film is present. Herein, it is preferable to layer the lower clad film on the substrate under reduced pressure in terms of adhesion and trailing. It is preferable to set a heating temperature of the resin film to 50 to 130° C. It is also preferable to set a press-boding pressure to about 0.1 to 1.0 MPa (about 1 to 10 kgf/cm$^2$). These conditions, however, are not particularly limited.

A thickness of the lower clad layer is not particularly limited. It is, however, preferable that the thickness is 2 to 50 µm. When the thickness is 2 µm or greater, it becomes easy to trap propagating light within the core. When the thickness is 50 µm or less, a thickness of the overall optical waveguide does not become too large. In the present invention, from the viewpoint of satisfying bending durability with a particularly small bend radius, it is more preferable that a thickness of the lower clad layer is in a range of 2 to 20 µm and it is further preferable that the thickness is in a range of 5 to 15 µm.

The term, "a thickness of the lower clad layer", referred to herein means a value from a boundary between the core portion and the lower clad layer to a bottom surface of the lower clad layer.

Subsequently, the lower clad film is cured with light or by heating and a core film having a higher refractive index than the lower clad film is layered thereon in the manner as above. On the resin film layered in this manner, active rays are irradiated like an image via a negative or positive mask pattern called an art work. Examples of a light source of active rays include known light sources that effectively emit ultraviolet rays, such as a carbon-arc lamp, a mercury vapor arc lamp, an ultrahigh pressure mercury lamp, a high-pressure mercury vapor lamp, and a xenon lamp. Alternatively, light sources that effectively emit visible light, such as a photographic flood light bulb and a solar lamp, are also available.

A core film having a higher refractive index than the lower clad film is manufactured in considerations of the following points.

That is, a height of the core portion is not particularly limited. It is, however, preferable that the height is 10 to 150 µm. When a height of the core portion is 10 µm or greater, an alignment tolerance does not decrease when bonded to the light receiving and emitting element after the optical waveguide is formed. When the height is 150 µm or less, bonding efficiency does not decrease when bonded to the light receiving and emitting element after the optical waveguide is formed. In the present invention, from the viewpoint of satisfying bending durability with a particularly small bend radius, it is more preferable that a height of the core portion is in a range of 10 to 120 µm and it is further preferable that the height is in a range of 30 to 90 µl.

Subsequently, a core pattern is manufactured by exposure followed by development, that is, by removing an unexposed portion by means of wet development or dry development. In the case of wet development, the core pattern is developed using a developer compatible with a composition of the resin film, such as an organic solvent, an alkaline aqueous solution, and a water-based developer, by a known method, for example, by means of spraying, shaking immersion, brushing, or scrapping.

A developer that is safe, stable, and easy to handle, such as an organic solvent and an alkaline aqueous solution, is preferably used. Examples of a developer based on the organic solvent include 1,1,1-trichloroethane, N-methylpyrrolidone, N,N-dimethylformamide, N,N-dimethylacetoamide cyclohexanone, methyl isobutyl ketone, and γ-butyrolactone. In order to prevent ignition, water may be added to these organic solvents in a range of 1 to 20 mass %.

Examples of salts of the alkaline aqueous solution include: alkali hydroxides, such as hydroxides of lithium, sodium, and potassium; alkaline carbonates, such as carbonates or bicarbonates of lithium, sodium, potassium, and ammonium; alkali metal phosphates, such as potassium phosphate and sodium phosphate; alkali metal pyrophosphates, such as sodium pyrophosphate and potassium pyrophosphate. Preferable examples of the alkaline aqueous solution used for development include a 0.1 to 5 mass % dilute solution of sodium carbonate, a 0.1 to 5 mass % dilute solution of potassium carbonate, a 0.1 to 5 mass % dilute solution of sodium hydroxide, and a 0.1 to 5 mass % dilute solution of sodium tetraborate. Also, it is preferable to set a pH of the alkaline aqueous solution used for development to a range of 9 to 14 and a temperature thereof is adjusted according to a development performance of a layer of the photosensitive resin composition. Also, the alkaline aqueous solution may be mixed with a surface-active agent, an antifoam agent, a small amount of organic solvent to promote development, and the like.

The water-based developer is formed of water or an alkaline aqueous solution and at least one type of organic solvent. Herein, besides the substances specified above, examples of the alkaline substance include borax, sodium metasilicate, tetramethylammonium hydroxide, ethanolamine, ethylene diamine, diethylene triamine, 2-amino-2-hydroxymethyl-1, 3-propanediol, 1,3-diaminopropanol-2, and morpholine. It is preferable to set a pH of the developer as small as possible in a range within which the resist is developed sufficiently. It is preferable to set a pH to 8 to 12 and it is more preferable to set a pH to 9 to 10. Examples of the organic solvent include triacetone alcohol, acetone, ethyl acetate, alkoxy ethanol having a $C_1$-$C_4$ alkoxy group, ethyl alcohol, isopropyl alcohol, butyl alcohol, diethylene glycol monomethyl ether, diethylene glycol monoethyl ether, and diethylene glycol monobutyl ether. One or a mixture of two or more of these examples is used. It is generally preferable to set a concentration of the organic solvent to 2 to 90 mass % and a temperature thereof can be adjusted according to a development performance. Also, the water-based developer may be mixed with a small amount of a surface-active agent, an antifoam agent, and the like.

Alternatively, two or more development methods may be used together when a need arises. Examples of the development method include a dipping method, a battle method, a spray method, such as a high-pressure spray method, brushing, and slapping.

As a post-development treatment, the core pattern may be heated to about 60 to 250° C. or exposed to light at light intensity of about 0.1 to 1000 mJ/cm$^2$ when a need arises so that the core pattern is further hardened.

The optical waveguide is manufactured by subsequently layering an upper clad film having a lower refractive index than the core film in the same manner as above. A thickness of the upper clad layer is not particularly limited as long as it is thick enough to embed the core portion therein. It is, however, preferable that a thickness of the dried upper clad layer is 2 to 50 µm. From the viewpoint of satisfying bending durability with a small bend radius, it is preferable that the thickness is in a range of 2 to 20 µm and it is more preferable that the thickness is in a range of 5 to 15 µm. The thickness of the upper clad layer may be the same as or different from the thickness of the lower clad layer formed first. The term, "a thickness of the upper clad layer", referred to herein means a value from the boundary between the core portion and the upper clad layer to the top surface of the upper clad layer.

The optical waveguide of the present invention has the optical axis conversion mirror in the core. The optical axis conversion mirror is to totally reflect light on an inclined surface that is preliminarily formed at an end of the core at an angle of 45 degrees with respect to a longitudinal direction of the core. The optical axis conversion mirror can be obtained by means of cutting using a dicing saw or the like.

As a blade attached to the dicing saw, a blade with a blade angle of 45 degrees is selected and a grinder grade of the blade is selected according to a subject to be processed. The blade forms a 45-degree inclined surface in the optical waveguide with less surface roughness as the blade rotates at a high-speed of several tens of thousand times while pure water is poured on the blade.

Flexible Electrical Wiring Board

As the flexible electrical wiring board, an FPC (Flexible Printed Circuit) board can be used suitably. Polyimide, polyamide, polyether imide, polyethylene terephthalate, liquid crystal polymers and the like are used as a substrate material of the FPC board. Generally, polyimide is used in terms of heat resistance and availability. An FPC board using, for example, Kapton® (product of Du Pont-Toray Co. Ltd.) is commercially available.

A thickness of the substrate forming the flexible electrical wiring board is not particularly limited and determined to suit required flexibility. More specifically, it is preferable that the thickness is in a range of 5 to 50 μm.

Opto-Electric Hybrid Board

The opto-electric hybrid board of the present invention is manufactured by bonding the optical waveguide film and the flexible electrical wiring board.

To join the optical waveguide film and the flexible electrical wiring board together, an adhesive may be used when a need arises. A type of the adhesive can be selected to suit materials of the optical waveguide film and the flexible electrical wiring board.

In order to confer flexibility to the opto-electric hybrid board, it is preferable that the cured adhesive is flexible. More specifically, the adhesive preferably has an elastic modulus of 700 MPa or less, more preferably 600 MPa or less, and further preferably 500 MPa or less, after curing. In terms of strength as an adhesive, the elastic modulus is preferably 1 MPa or more, and more preferably 5 MPa or more.

Examples of a type of the adhesive include an acrylic-rubber-based adhesive and commercially available products, such as KS7003 (elastic modulus: 700 MPa) that is a high heat-resistance adhesive insulating material available from Hitachi Chemical Co., Ltd. and Hi-Bon® 808 (elastic modulus: 50 MPa) that is an adhesive for flexible printed circuit board available from Hitachi Kasei Polymer Co., Ltd.

A joining method of the optical waveguide film and the flexible electrical wiring board is not particularly limited except for one thing that the optical axis conversion mirror in the optical waveguide substrate and the light receiving and emitting element are bonded to each other with accuracy as described above. However, in terms of adhesiveness and preventing bubble inclusion, it is preferable to adopt a method that uses a roll laminator or a flat plate laminator. It is preferable to set a lamination temperature of the roll laminator to a range of room temperature (25° C.) to 100° C. When the lamination temperature is as high as or higher than room temperature (25° C.), adhesiveness to the optical waveguide can be enhanced. When the lamination temperature is 100° C. or less, a required film thickness can be obtained without causing an adhesive layer to flow. In view of the foregoing, it is more preferable that the lamination temperature is in a range of 40 to 100° C. It is preferable that a pressure is 0.2 to 1.0 MPa (1 to 10 kgf/cm$^2$) and it is preferable that a lamination speed is 0.1 to 3 m/min. It should be appreciated, however, that these conditions are not particularly limited.

Also, the term, "the flat plate laminator", referred to herein means a laminator that sandwiches lamination materials between a pair of flat plates and press-bonds the lamination materials by applying a pressure onto the flat plates. For example, a vacuum pressure laminator can be suitably used.

Herein, it is preferable to set a heating temperature to 50 to 100° C. and it is preferable to set a press-bonding pressure to 0.1 to 1.0 MPa (1 to 10 kgf/cm$^2$). It should be appreciated, however, that these conditions are not particularly limited.

When considerations are given to an adhesion property between the optical waveguide film and the flexible electrical wiring board, it is preferable to join these components across the entire surfaces.

Alignment Recess Forming Apparatus

Figure 4:
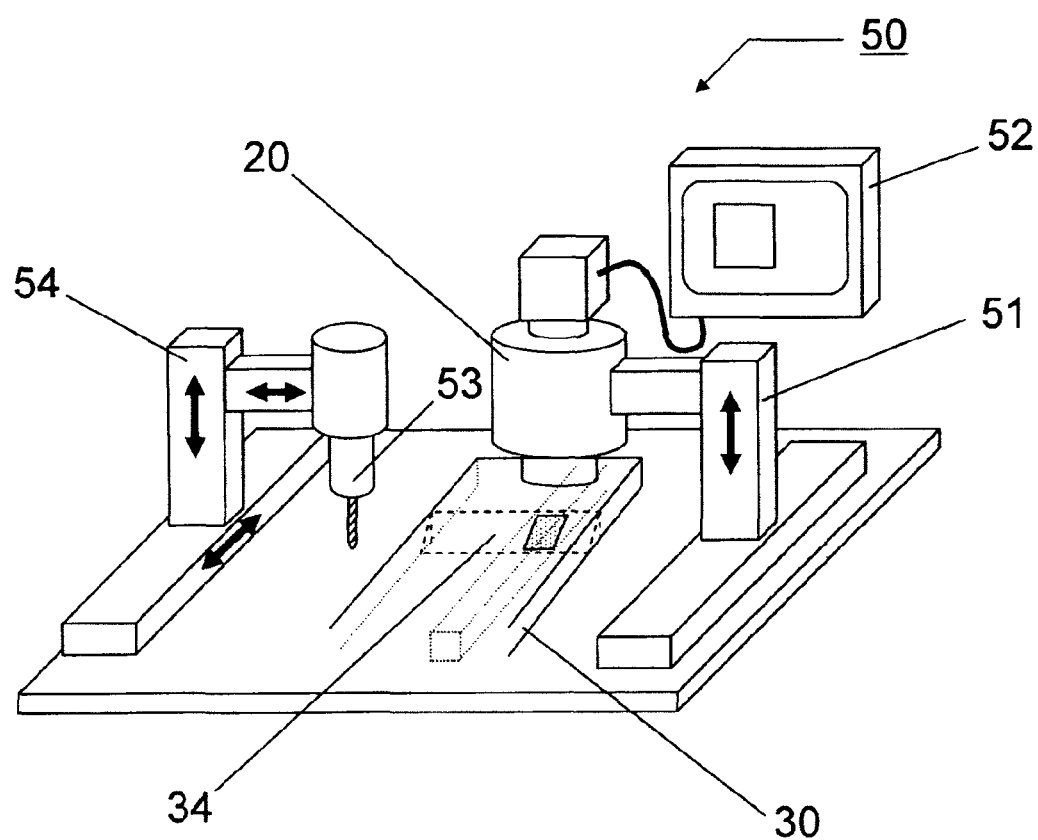
FIG. 4 is a conceptual view showing a configuration of an alignment recess forming apparatus for an optical waveguide.

The present invention also includes an alignment recess forming apparatus. More specifically, an alignment recess forming apparatus includes an optical microscope, a moving mechanism portion that moves up and down a lens of the optical microscope, a processing drill, a moving mechanism portion that moves the processing drill, and an observation image computation device that takes in an observation image viewed through the optical microscope and performs image processing. Hereinafter, a detailed description will be given with reference to FIG. 4.

An alignment recess forming apparatus 50 of the present invention enables an observation of an optical axis conversion mirror portion in an optical waveguide substrate including the optical waveguide 30 having a core and a clad and provided with the optical axis conversion mirror 34 in the core. To this end, a lens moving mechanism portion 51 in which the optical waveguide substrate is set and configured to move up and down the lens of the optical microscope 20 moves the lens up and down, so that at least an image captured when the microscope is focused to a highest point (top point) of the core in the optical axis conversion mirror portion 34 and an image captured when the microscope is focused to a lowest point (bottom point) are obtained. Further, an image may be captured by focusing the microscope to a midpoint between the top point and the bottom point. It is more preferable to obtain a larger number of images because an outline of the core can be obtained with accuracy.

Subsequently, observation images through the optical microscope obtained by the method as above are taken into an observation image computation device 52 to obtain an outline of the core by performing image processing (synthesizing images). It should be noted that at least an image at the top point and an image at the bottom point are used to obtain an outline of the core.

Subsequently, a center of gravity of the outline is determined by the observation image computation device 52. A center of gravity can be an intersection of diagonals. After the center of gravity is determined, a processing drill 53 is moved by a processing drill moving mechanism 54 configured to move the processing drill 53 to a position spaced by a specific distance from the center of gravity. Then, an alignment recess is formed by this drill at least at two points. Herein, the alignment recess can be a through-hole or a non-penetrating recess (hollow) as described above.

Operations as described above can be performed manually. However, by automating a series of works by the observation image computation device 52, working efficiency and production efficiency can be enhanced.

EXAMPLES

Hereinafter, an Example of the present invention will be described more specifically. It should be understood, however, that the present invention is not limited to the example below.

Evaluation Method
Evaluation Method of Alignment Accuracy

An observation stage movable in XY directions and a displacement sensor capable of reading in 0.1 μm (GT2 available from Keyence Corporation) were provided to the optical microscope. Subsequently, an intersection of a crossed mark provided to an eye lens of the microscope was set on four points of the recess at 12, 3, 6, and 9 o'clock positions to read distances travelled. A center position of the recess in the XY directions was measured by finding an average of the distances travelled. Herein, a lens magnifying power of the optical microscope was set high enough to secure a field of view about double the diameter of the recess.

Subsequently, horizontal and vertical edge positions and a center position of the mirror of the optical axis conversion portion were measured in the same manner. Herein, the microscope is focused to the highest position of the core by moving up and down the focal position and a position of one edge was measured when contrast of the edge was sharp. Then, a position of the other edge was measured by focusing the microscope to the lowest position of the core. Further, edge positions in a horizontal direction of the core were measured on the right and left by focusing the microscope to the vicinity of the center of the core in thickness. The center position in the XY directions was measured by finding the horizontal and vertical edge positions of the mirror of the optical axis conversion portion and an average thereof on the basis of the distances the stage had travelled to the four points specified above.

Alignment accuracy was evaluated by measuring a relative position of the recess with respect to the mirror of the optical axis conversion portion and by calculating an amount of misalignment from the pre-set relative position.

Example 1

(1-1) Manufacturing of Optical Waveguide Film
Manufacturing of Clad Layer Forming Resin Film Herein, 48 parts by mass of phenoxy resin (available from Tohto Kasei Co., Ltd under the product name of Pheno-Tohto® YP-70) as the binder polymer (A), 49.6 parts by mass of alicyclic diepoxy carboxylate (available from Asahi Denka Kogyo K.K. under the product name of KRM-2110, molar weight: 252) as the photopolymerizable compound (B), 2 parts by mass of triphenyl sulfonium hexafluoro antimonate salt (available from Asahi Denka Kogyo K.K. under the product name of SP-170) as the photopolymerization initiator (C), 0.4 part by mass of SP-100 (available from Asahi Denka Kogyo K.K. under this product name) as an intensifier, and 40 parts by mass of propylene glycol monomethyl ether acetate as an organic solvent were weighted in a wide-mouth polyethylene bottle. The mixture was kept stirred for six hours with a mechanical stirrer, a shaft, and a propeller under conditions at a temperature of 25° C. and a rotation speed of 400 rpm to prepare a resin varnish A for forming a clad layer. Then, with the use of a polychlorofluorocarbon filter having a pore diameter of 2 μm (available from Advantec Toyo Kaisha, Ltd., under the product name of PF020), the resulting varnish A was subjected to filtration under increased pressure under conditions at a temperature of 25° C. and a pressure of 0.4 MPa. Further, the varnish A was subjected to defoaming under reduced pressure for 15 minutes using a vacuum pump and a bell jar under conditions at a degree of decompression of 50 mmHg.

The resin varnish A for forming the clad layer thus obtained was applied onto a corona treated surface of a polyamide film (available from Toray Industries Inc. under the product name of Mictron®, thickness: 12 μm) using a coater (multi-coater TM-MC available from Hirano Tecseed Co., Ltd.) and dried for ten minutes at 80° C. and then for another ten minutes at 100° C. Subsequently, as a protective film, a release PET film (available from Teijin DuPont Films under the product name of Purex® A31, thickness: 25 μm) was laminated to the dried varnish A with a releasing surface on the resin side. A resin film for forming a clad layer was thus obtained. A thickness of the resin layer in this instance was arbitrarily adjustable by regulating a gap of the coater. In the present Example 1, the thickness was adjusted so that film thicknesses after curing of the lower clad layer and the upper clad layer were 20 μm and 70 μm, respectively.

Manufacturing of Resin Film for Forming Core Layer

Herein, a resin varnish B for forming a core layer was prepared in the same manner and under the same conditions as in the manufacturing example described above except that 26 parts by mass of phenoxy resin (available from Tohto Kasei Co., Ltd under the product name of PhenoTohto® YP-70) was used as the binder polymer (A), 36 parts by mass of 9,9-bis[4-(2-acryloyloxyethoxy)phenyl]fluorene (available from Shin-Nakamura Chemical Co., Ltd. under the product name of A-BPEF) and 36 parts by mass of bisphenol A-type epoxy acrylate (available from Shin-Nakamura Chemical Co., Ltd. under the product name of EA-1020) were used as the photopolymerizable compound (B), 1 part by mass of bis(2,4,6-trimethylbenzoyl)phenylphosphine oxide (available from Chiba Specialty Chemicals under the product name of IRGACURE® 819) and 1 part by mass of 1-[4-(2-hydroxyethoxy)phenyl]-2-hydroxy-2-methyl-1-propane-1-one (available from Chiba Specialty Chemicals under the product name of IRGACURE® 2959) were used as the photopolymerization initiator (C), and 40 parts by mass of propylene glycol monomethyl ether acetate was used as an organic solvent. Thereafter, the resulting varnish B was subjected to filtration under increased pressure followed by defoaming under reduced pressure in the same manner and under the same conditions as in the manufacturing example described above.

The resin varnish B for forming the core layer thus obtained was applied onto an untreated surface of a PET film (available from Toyobo Co., Ltd. under the product name of COSMOSHINE® A1517, thickness: 16 μm) followed by drying in the same manner as in the manufacturing example described above. Subsequently, as a protective film, a release PET film (available from Teijin DuPont Films under the product name of Purex® A31, thickness: 25 μm) was laminated onto the dried varnish B with a releasing surface on the resin side. A resin film for forming a core layer was thus obtained. In the present Example 1, a gap of the coater was adjusted so that a film thickness after curing was 50 μm.

Manufacturing of Optical Waveguide Film

The release PET film (Purex® A31) as a protective film of the resin film for forming the lower clad layer obtained as above was removed. Then, ultraviolet rays (wavelength: 365 nm) were irradiated to the resin film for forming the lower clad layer from the resin side (from the side opposite to the base material film) at light intensity of 1 J/cm$^2$ using an UV exposure device (EXM-1172 available from ORC Manufacturing Co., Ltd.). Subsequently, the resin film for forming the lower clad layer was subjected to heat treatment at 80° C. for ten minutes. The lower clad layer was thus formed.

Subsequently, the resin film for forming the core layer was laminated on the lower clad layer using a roll laminator (HLM-1500 available from Hitachi Chemical Techno-Plant Co., Ltd.) under conditions at a pressure of 0.4 MPa, a temperature of 50° C., and a lamination speed of 0.2 m/min.

Subsequently, after vacuuming to 500 Pa or less using a vacuum pressure laminator (MVLP-500 available from Meiki Co., Ltd.) as a flat plate laminator, the lower clad layer and the resin film for forming the core layer were heated and press-bonded under conditions at a pressure of 0.4 MPa and a temperature of 50° C. and for a pressure time of 30 seconds. The core layer was thus formed.

Subsequently, ultraviolet rays (wavelength: 365 nm) were irradiated to the core layer at light intensity of 0.6 J/cm$^2$ via a 50-μm-wide negative photo-mask using the UV exposing device specified above. Subsequently, the core layer was heated at 80° C. for five minutes after exposure. Then, the PET film as a supporting film was removed and the core pattern was developed using a developer (propylene glycol monomethyl ether acetate/N,N-dimethyl acetoamide=8/2 in mass ratio). Subsequently, the core layer was rinsed with a rinse solution (isopropanol) followed by heating and drying at 100° C. for ten minutes.

Subsequently, the resin film for forming the clad layer as the upper clad layer was laminated on the core layer under the same lamination conditions as above. Further, after ultraviolet rays (wavelength: 365 nm) were irradiated on the both surfaces at light intensity of 25 J/cm$^2$ in total, the upper clad layer was formed by heating the resin film for forming the clad layer for one hour at 160° C. A flexible optical waveguide provided with the base material film on the outside was thus manufactured. Further, in order to remove the polyamide film, the flexible optical waveguide was treated for 24 hours under conditions at high temperature and humidity of 85° C./85%. The flexible optical waveguide from which the base material film was removed was thus manufactured.

Refractive indices of the core layer and the clad layers were measured using a prism coupler (Model 2010) available from Metricon Corporation. Then, refractive indices at a wavelength of 830 nm were 1.584 for the core layer and 1.550 for the clad layer. Also, a propagation loss in the optical waveguide thus manufactured was found to be 0.05 dB/cm when measured using a 850-nm vertical cavity surface emitting laser (FLS-300-01-VCL available from EXFO Inc.) as a light source and Q82214 available from Advantest Corporation as a light receiving sensor by a cut-back method (measurement waveguide length: 10, 5, 3, 2 cm, incoming fiber: GI-50/125 multi-mode fiber (NA=0.20), and outgoing fiber: SI-114/125 (NA=0.22).

Also, a tensile elastic modulus and a tension strength of the optical waveguide film thus obtained were measured by the method as above. Then, it was found that the tensile elastic modulus was 2,000 MPa and the tension strength was 70 MPa.

Subsequently, the optical axis conversion mirror was manufactured using a dicing saw (DAD-341 available from DISCO Inc.). The dicing blade had an abrasive grain #5000, the blade angle of 45 degrees, a feed rate of 1 mm/s, and a spindle rotation speed of 30,000 RPM. A groove was formed with a wet method while pouring pure water to the blade at 1 L/min.

Subsequently, the core portion of the optical axis conversion mirror in the optical waveguide film was roughly divided by four and observed by shifting the focal point using an optical microscope (metallograph BH2 available from Olympus Corporation). From this observation, four images were obtained, including those captured by focusing the microscope to the top point and the bottom point. An outline of the core was obtained by synthesizing these images. Because the outline of the core was 50 μm in length and 70 μm in width, a center of gravity determined according to the outline was set on a position at an intersection of the diagonals.

Given that a direction parallel to the core of the optical waveguide is an x axis and a direction perpendicular to the core is a y axis. Then, two points at a position (+500 μm, +1000 μm) and a position (+500 μm, −1000 μm) in the (x, y) coordinate representation were set as the positions of the alignment recess. Accordingly, through-holes having a diameter of 600 μm were formed in these portions using a processing drill and a pin having a diameter of 595 μm was put in each through-hole.

(1-2) Manufacturing of Sheet-Like Adhesive

Herein, 100 parts by mass of HTR-860P-3 (glycidyl-containing acryl rubber available under this product name from Teikoku Chemical Industry Co., Ltd., molar weight: 1,000,000, Tg: −7° C.), 5.4 parts by mass of YDCN-703 (o-cresol novolac-type epoxy resin available under this product name from Tohto Kasei Co., Ltd, epoxy equivalent: 210), 16.2 parts by mass of YDCN-8170C (bisphenol F-type epoxy resin available under this product name from Tohto Kasei Co., Ltd., epoxy equivalent: 157), 15.3 parts by mass of Plyophen® LF2882 (bisphenol A-novolac resin available under this product name from Dainippon Ink and Chemicals, Inc.), 0.1 part by mass of NUCA-189 (γ-mercaptopropyl trimethoxy silane available under this product name from Nippon Unicar Company Limited), 0.3 part by mass of NUCA-1160 (γ-ureidopropyl triethoxy silane available under this product name from Nippon Unicar Company Limited), 30 parts by mass of A-DPH (dipentaerythritol hexaacrylate available under this product name from Shin-Nakamura Chemical Co. Ltd.), 1.5 parts by mass of IRGACURE® 369 (I-369, 2-benzil-2-dimethylamino-1-(4-morpholinophenyl)-butanone-1-one available under this product name from Chiba Specialty Chemicals), and cyclohexane were mixed with stirring followed by vacuum deairing. The resulting adhesive varnish was applied onto a 75-μm-thick surface release treated polyethylene terephthalate (Teijin® Tetoron® film A-31 available from Teijin Limited) and a pressure-sensitive adhesive sheet was obtained by heating and drying the adhesive varnish at 80° C. for 30 minutes. By laminating an 80-μm-thick light-transmitting supporting base material (FHF-100, a triple-layer film of low-density polyethylene terephthalate/vinyl acetate/low-density polyethylene terephthalate available from Thermo Co., Ltd.) to this pressure-sensitive adhesive sheet, a sheet-like adhesive formed of a protective film (surface-release-treated polyethylene terephthalate), a pressure-sensitive adhesive layer, and a light-transmitting supporting base material was manufactured. A thickness of the pressure-sensitive adhesive layer was 10 μm.

The pressure-sensitive adhesive layer of the sheet-like adhesive manufactured in this manner was cured for one hour at 160° C. to measure a light transmittance using a U-3310 ultraviolet-visible spectrophotometer available from Hitachi High-Technologies Corporation. Then, it was found that the adhesive layer had a light transmittance as high as 98% or above at a wavelength of 850 nm and a transmittance loss was comparable to 0.1 dB or less.

A refractive index measured using a prism coupler (Model 2010) available from Metricon Corporation was 1.505 at a wavelength of 830 nm.

Also, a tensile elastic modulus of the obtained sheet-like adhesive was measured by the method described above and the tensile elastic modulus was 350 MPa.

(1-3) Manufacturing of Opto-Electric Hybrid Board

The sheet-like adhesive from which the protective film was removed was laminated onto the flexible optical waveguide using a roll laminator (HLM-1500 available from Hitachi Chemical Techno-Plant Co., Ltd) under conditions at a pressure of 0.4 MPa, a temperature of 50° C., and a lamination speed of 0.2 m/min. Subsequently, the waveguide was made into a strip shape (length: 100 mm, width: 3 mm) using a dicing saw (DAD-341 available from Disco Corporation) and ultraviolet rays (365 nm) were irradiated to the resulting waveguide from the supporting base material side at light intensity of 250 mJ/cm$^2$ to remove the supporting base material by lowering adhesion at an interface of the pressure-sensitive adhesive layer and the supporting base material. An optical waveguide with an adhesive was thus obtained.

Subsequently, alignment recesses were formed in a flexible electrical wiring board having electrical wiring and a light receiving and emitting element (length: 20 mm, width: 3 mm, base material: Kapton® 100EN, substrate thickness: 25 µm, copper circuit thickness: 12 µm). The alignment recesses were set to coincide with the coordinate positions (x, y) of the optical waveguide, so that a center portion of the light receiving and emitting element coincides with the center of gravity of the optical axis conversion mirror in the optical waveguide by matching the alignment recesses to the positions of the alignment recesses formed in the optical waveguide. Then, through-holes were formed with a processing drill.

Subsequently, the optical waveguide with an adhesive was positioned at a predetermined location in the flexible electrical wiring board by putting the pins provided to the optical waveguide film into the alignment through-holes formed in the flexible electrical wiring board. After vacuuming to 500 Pa or less using a vacuum pressure laminator (MVLP-500 available from Meiki Co., Ltd.), the optical waveguide film and the flexible electrical wiring board were press-bonded temporarily under conditions at a pressure of 0.4 MPa and a temperature of 50° C. and for a pressure time of 30 seconds, followed by heating in a clean oven at 160° C. for one hour, so that the optical waveguide film and the flexible electrical wiring board were bonded to each other. An opto-electric hybrid board was thus obtained.

A light transmittance of Kapton® EN, which was used as the base material of the flexible electrical wiring board, was measured using a U-3310 spectrophotometer available from Hitachi High-Technologies Corporation and the light transmittance was 98% at a wavelength of 850 nm. This means a transmission loss was comparable to 0.1 dB. Hence, even added up with a transmission loss in the pressure-sensitive adhesion layer described above, a light loss when light passes through the electric wiring board was as small as less than 0.5 dB. Accordingly, the present Example 1 adopts a structure without a light-transmitting through-hole.

An evaluation result is as follows. That is, because a light loss when light coming out from the light emitting element goes into the other light receiving element by passing through the waveguide is 2 dB, it was an efficient light transmission result with substantially no misalignment between the waveguide core portion in the optical axis conversion mirror and the light receiving and emitting element.

Comparative Example 1

An opto-electric hybrid board was obtained in the same manner as in Example 1 above except that the optical waveguide film and the flexible electric wiring board were aligned as in Example 1 above by a method in the related art using a metal marker described below. More specifically, two points at the positions (+500 µm, +1000 µm) and (+500 µm, −1000 µm) in the (x, y) coordinate representation were set as alignment metal marker positions as with the recess positions in Example 1 above. The markers having a diameter of 200 µm were formed in these portions by resist exposure, development, metal deposition, and resist separation processes. The optical axis conversion mirror was formed at a point off-set by −500 µm in an X direction parallel to a line linking the centers of these markers, at which the light emitting element and the light receiving element were expected to be bonded. Subsequently, in reference to these markers, the flexible electric wiring board having the light receiving and emitting element was positioned with respect to the optical waveguide with an adhesive. An opto-electric hybrid board was obtained by bonding the optical waveguide film and the flexible electric wiring board.

An evaluation result is as follows. That is, a light loss from the light emitting element to the light receiving element was 4 dB and alignment was so poor that there was misalignment of 20 µm between the waveguide core portion in the optical axis conversion mirror and the light receiving and emitting element. Hence, a light transmission result was inefficient. A light transmission result was inefficient because there was a light loss of 4 dB from the light emitting element to the light receiving element and alignment was so poor that there was misalignment of 20 µm between the waveguide and the light receiving and emitting element.

INDUSTRIAL APPLICABILITY

According to the method of the present invention, it becomes possible to provide an optical waveguide substrate in which an optical axis conversion mirror in the optical waveguide substrate and a light receiving and emitting element are aligned with respect to each other at so extremely high a degree of accuracy that a transmission loss of light can be smaller and a manufacturing method thereof. More specifically, it becomes possible to allow an amount of relative positional misalignment of the optical waveguide with respect to the light receiving and emitting element to fall within ±10 µm.

Also, according to the present invention, it becomes possible to obtain an opto-electric hybrid board in which an optical axis conversion mirror in an optical waveguide substrate and a light receiving and emitting element are aligned with respect to each other at so extremely high a degree of accuracy that a transmission loss of light can be smaller and a manufacturing method thereof. More specifically, it becomes possible to allow an amount of relative positional misalignment of the optical waveguide with respect to the light receiving and emitting element to fall within ±10 µm.

Further, according to an alignment recess forming apparatus for an optical waveguide of the present invention, it becomes possible to manufacture the optical waveguide and an optical waveguide hybrid board at high production efficiency.

| Description of Numeral References and Signs | |
|---|---|
| 10: | optical waveguide |
| 11: | upper clad |
| 12: | core portion |
| 13: | lower clad |
| 14: | optical axis conversion mirror |
| 14a: | highest position of the core in the optical axis conversion mirror (position in contact with the upper clad, top point) |
| 14b: | 2/4 portion from 14a when a space between 14a and 14d is divided by four |
| 14c: | 3/4 portion from 14a when the space between 14a and 14d is divided by four |

| | Description of Numeral References and Signs |
|---|---|
| 14d: | lowest position of the core in the optical axis conversion mirror (position in contact with the lower clad, bottom point) |
| 20: | optical microscope |
| 30: | optical waveguide |
| 31: | upper clad |
| 32: | core portion |
| 33: | lower clad |
| 34: | optical axis conversion mirror |
| 35: | protective plate |
| 36: | positioning through-hole |
| 37: | pin |
| 40: | light receiving and emitting element mounted substrate |
| 41: | light receiving and emitting element |
| 42: | positioning through-hole |
| x: | distance between the light receiving and emitting element and the positioning through-hole |
| y: | distance between the center of gravity of the outline of the core and a position of the alignment recess |
| 50: | alignment recess forming apparatus |
| 51: | lens moving mechanism portion |
| 52: | observation image computation device |
| 53: | processing drill |
| 54: | processing drill moving mechanism portion |

The invention claimed is:

1. A manufacturing method of an optical waveguide substrate including a core and a clad and provided with an optical axis conversion mirror in the core and an alignment recess for the optical axis conversion mirror with respect to a light receiving and emitting element,
wherein the recess is obtained by:
obtaining an outline of a core by synthesizing at least an image captured by focusing a microscope to a highest position of the core in an optical axis conversion mirror portion and an image captured by focusing the microscope to a lowest position; and
determining a position of the alignment recess in reference to a center of gravity of the outline.

2. The manufacturing method of an optical waveguide substrate according to claim 1, wherein:
the recess is formed at least at two points.

3. The manufacturing method of an optical waveguide substrate according to claim 1, wherein:
the recess is a through-hole.

4. An optical waveguide substrate obtained by the manufacturing method according to claim 1.

5. A manufacturing method of an opto-electric hybrid board, comprising:
joining an optical waveguide substrate including a core and a clad and provided with an optical axis conversion mirror in the core and an alignment recess for the optical axis conversion mirror with respect to a light receiving and emitting element to a light receiving and emitting element mounted substrate provided with an alignment recess,
wherein:
the recess is obtained by obtaining an outline of the core by synthesizing at least an image captured by focusing a microscope to a highest position of the core in an optical axis conversion mirror portion and an image captured by focusing the microscope to a lowest position, and determining a position of the alignment recess in reference to a center of gravity of the outline;
a position of the alignment recess in the light receiving and emitting element mounted substrate is determined so that a distance coincides with a distance from the center of gravity of the outline to the position of the alignment recess determined earlier; and
the optical waveguide substrate and the light receiving and emitting element mounted substrate are aligned by the respective alignment recesses.

6. The manufacturing method of an opto-electric hybrid board according to claim 5, wherein:
the optical waveguide substrate is an optical waveguide film and the light receiving and emitting element mounted substrate is a flexible electrical wiring board.

7. An alignment recess forming apparatus that forms an alignment recess in an optical waveguide substrate including a core and a clad and provided with an optical axis conversion mirror in the core, comprising:
an optical microscope;
a moving mechanism portion that moves up and down a lens of the optical microscope;
a processing drill;
a moving mechanism portion that moves the processing drill; and
an optical microscope observation image computation device, wherein the observation image computation device obtains an outline of the core by synthesizing an image captured by focusing the microscope to a highest position of the core in an optical axis conversion mirror portion and an image captured by focusing the microscope to a lowest position, and determines a position of the alignment recess in reference to a center of gravity of the outline.

* * * * *